US010026610B2

(12) United States Patent
Kawada et al.

(10) Patent No.: US 10,026,610 B2
(45) Date of Patent: Jul. 17, 2018

(54) SILICON CARBIDE SEMICONDUCTOR DEVICE MANUFACTURING METHOD

(71) Applicant: FUJI ELECTRIC CO., LTD., Kawasaki-shi (JP)

(72) Inventors: Yasuyuki Kawada, Tsukuba (JP); Yoshiyuki Yonezawa, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 232 days.

(21) Appl. No.: 14/682,600

(22) Filed: Apr. 9, 2015

(65) Prior Publication Data

US 2015/0214049 A1 Jul. 30, 2015

Related U.S. Application Data

(63) Continuation of application No. PCT/JP2013/076435, filed on Sep. 27, 2013.

(30) Foreign Application Priority Data

Nov. 13, 2012 (JP) ................................ 2012-249763

(51) Int. Cl.

*C30B 25/10* (2006.01)
*H01L 21/02* (2006.01)

(Continued)

(52) U.S. Cl.

CPC ........ *H01L 21/02529* (2013.01); *C30B 25/02* (2013.01); *C30B 25/10* (2013.01);

(Continued)

(58) Field of Classification Search

CPC ....... C30B 29/36; C30B 25/02; C30B 25/165; H01L 21/02529; H01L 21/02378; H01L 21/02447; H01L 29/1608

See application file for complete search history.

(56) References Cited

U.S. PATENT DOCUMENTS

| | | | | |
|---|---|---|---|---|
| 2007/0108450 A1* | 5/2007 | O'Loughlin | ............ | C30B 25/02 257/77 |
| 2009/0114148 A1* | 5/2009 | Stahlbush | .............. | C30B 25/02 117/89 |

(Continued)

FOREIGN PATENT DOCUMENTS

| | | |
|---|---|---|
| JP | H07-183231 | 7/1995 |
| JP | 2000-150393 | 5/2000 |

(Continued)

OTHER PUBLICATIONS

L. Storasta et al., "Deep levels created by low energy electron irradiation in 4H-SiC", AIP: Journal of Applied Physics (USA), American Institute of Physics, Jan. 1, 2004, vol. 96, Issue 9, pp. 4,909 to 4,915.

(Continued)

*Primary Examiner* — Matthew Song
(74) *Attorney, Agent, or Firm* — Rabin & Berdo, P.C.

(57) ABSTRACT

Provided is a method of manufacturing a silicon carbide semiconductor device with a long carrier lifetime without carrying out an additional step after a SiC single crystal substrate is fabricated using a chemical vapor deposition method. The silicon carbide semiconductor device manufacturing method includes (a) growing a silicon carbide single crystal film at a first temperature on a silicon carbide semiconductor substrate using chemical vapor deposition; (b) cooling the silicon carbide semiconductor substrate from the first temperature to a second temperature, which is lower than the first temperature, in an atmosphere of a carbon-containing gas after growing the silicon carbide crystal film; and (c) subsequently cooling the silicon carbide semiconductor substrate to a third temperature, which is lower than the second temperature, in a hydrogen gas atmosphere.

16 Claims, 6 Drawing Sheets

(51) Int. Cl.

| | |
|---|---|
| ***C30B 25/02*** | (2006.01) |
| ***C30B 25/20*** | (2006.01) |
| ***C30B 29/36*** | (2006.01) |
| ***H01L 29/78*** | (2006.01) |
| ***H01L 21/04*** | (2006.01) |
| ***H01L 29/04*** | (2006.01) |
| ***H01L 29/16*** | (2006.01) |
| ***C30B 25/16*** | (2006.01) |

(52) U.S. Cl.

CPC .............. *C30B 25/16* (2013.01); *C30B 25/20* (2013.01); *C30B 29/36* (2013.01); *H01L 21/0262* (2013.01); *H01L 21/02378* (2013.01); *H01L 21/02447* (2013.01); *H01L 21/0445* (2013.01); *H01L 29/045* (2013.01); *H01L 29/1608* (2013.01); *H01L 29/78* (2013.01)

(56) References Cited

U.S. PATENT DOCUMENTS

2011/0059003 A1* 3/2011 Sudarshan ............. C30B 25/10
423/345
2011/0312161 A1* 12/2011 Hamano ................ C30B 25/02
438/478
2012/0146056 A1* 6/2012 Momose ................ C30B 25/20
257/77

FOREIGN PATENT DOCUMENTS

JP 2006-321696 11/2006
JP 2010-095431 4/2010
JP 2010095431 A * 4/2010 ............. C30B 29/36

OTHER PUBLICATIONS

L. Storasta et al., “Reduction of traps and improvement of carrier lifetime in 4H-SiC epilayers by ion implantation”, AIP: Applied Physics Letters (USA), American Institute of Physics, 2007, vol. 90, pp. 062116-1 to 062116-3.

T. Hiyoshi et al., “Reduction of Deep Levels and Improvement of Carrier Lifetime in n-Type 4H-SiC by Thermal Oxidation”, APEX: Applied Physics Express, Applied Physics, 2009, vol. 2, pp. 041101-1 to 041101-3.

* cited by examiner

| LEVEL | DENSITY ($cm^{-3}$) |
|---|---|
| $Z_{1/2}$ CENTERS | $6.2 \times 10^{13}$ |
| $EH_{6/7}$ CENTERS | $4.4 \times 10^{13}$ |

FIG. 3

| | AMOUNT OF $C_3H_8$ GAS ADDED WITH RESPECT TO $H_2$ GAS | $Z_{1/2}$ CENTER DENSITY ($cm^{-3}$) |
|---|---|---|
| COMPARISON EXAMPLE | 0% | $6.2 \times 10^{13}$ |
| SAMPLE 1-1 | 0.1% | $1.4 \times 10^{13}$ |
| SAMPLE 1-2 | 0.2% | $1.2 \times 10^{13}$ |
| SAMPLE 1-3 | 0.3% | $1.1 \times 10^{13}$ |
| SAMPLE 1-4 | 0.4% | $1.2 \times 10^{13}$ |

FIG. 4

| | AMOUNT OF HCl GAS ADDED WITH RESPECT TO $H_2$ GAS | $Z_{1/2}$ CENTER DENSITY ($cm^{-3}$) |
|---|---|---|
| SAMPLE 2-1 | 0% | $9.9 \times 10^{12}$ |
| SAMPLE 2-2 | 0.5% | $7.9 \times 10^{12}$ |
| SAMPLE 2-3 | 1.0% | $6.7 \times 10^{12}$ |
| SAMPLE 2-4 | 1.5% | $6.5 \times 10^{12}$ |

FIG. 6

| | CARRIER LIFETIME (μs) |
|---|---|
| SECOND EXAMPLE | 4.0~10 |
| COMPARISON EXAMPLE | 0.10~0.18 |

SILICON CARBIDE SEMICONDUCTOR DEVICE MANUFACTURING METHOD

CROSS-REFERENCE TO RELATED APPLICATION(S)

This non-provisional Application is a continuation of and claims the benefit of the priority of Applicant's earlier filed International Application No. PCT/JP2013/076435 filed Sep. 27, 2013, the entire contents of which are incorporated herein by reference.

BACKGROUND OF THE INVENTION

1. Field of the Invention

The present invention relates to a silicon carbide semiconductor device manufacturing method.

2. Background of the Related Art

Compound semiconductors, such as silicon carbide four layer repeat hexagonal crystals (4H—SiC), are commonly known as semiconductor materials. When fabricating a power semiconductor device using 4H—SiC as a semiconductor material, a 4H—SiC single crystal film (hereafter referred to as "a SiC epitaxial film") is epitaxially grown on a semiconductor substrate formed of 4H—SiC (hereafter referred to as "a 4H—SiC substrate"), thereby fabricating a SiC single crystal substrate. To date, a chemical vapor deposition (CVD) method is commonly known as an epitaxial growth method.

Specifically, a SiC single crystal substrate, wherein a SiC epitaxial film is deposited using a chemical vapor deposition (CVD) method, is fabricated by a raw material gas fed into a reactor (chamber) being thermally decomposed in a carrier gas, and silicon (Si) atoms being continuously deposited in line with the crystal lattice of a 4H—SiC substrate. Commonly, monosilane ($SiH_4$) gas and dimethylmethane ($C_3H_8$) gas are used as raw material gases, while hydrogen ($H_2$) is used as a carrier gas. Also, nitrogen (N2) gas or trimethylaluminum (TMA) gas is added as appropriate as a dopant gas.

Existing epitaxial growth methods are such that growth speed is generally in the region of several μm/hour, because of which it is not possible to grow an epitaxial film at high speed. Consequently, a large amount of time is taken to grow an epitaxial film of the thickness of 100 μm or more necessary in order to fabricate a high breakdown voltage device, because of which an increase in epitaxial growth speed is required for industrial production. Also, a high breakdown voltage device is such that, as an epitaxial film of a thickness of 100 μm or more is provided as a drift layer, the further breakdown voltage is increased, the greater conduction loss becomes.

In order to reduce conduction loss, it is necessary to cause conductivity modulation due to minority carrier implantation by increasing the carrier lifetime of the drift layer, thereby reducing on-state voltage. Consequently, in order to increase the carrier lifetime of the drift layer, it is necessary to reduce crystal defects forming lifetime killers that exist in the epitaxial film. For example, point defects known as $Z_{1/2}$ centers and $EH_{6/7}$ centers that exist in an energy position lower than the bottom (Ec=0) of a conduction band (at a deep level) are commonly known as crystal defects that exist in an n-type SiC epitaxial film and form lifetime killers.

It has been reported that the $Z_{1/2}$ centers and $EH_{6/7}$ centers are crystal defects caused by carbon (C) vacancies in a SiC epitaxial film. For example, refer to L. Storasta, et al., "Deep levels created by low energy electron irradiation in 4H—SiC", AIP: Journal of Applied Physics (USA), American Institute of Physics, Jan. 1, 2004, Volume 96, Issue 9, Pages 4,909 to 4,915 (Non-Patent Literature 1). Consequently, in order to reduce the crystal defects in a SiC epitaxial film, it is necessary to form a SiC epitaxial film with few carbon vacancies. A method whereby, after a SiC epitaxial film is formed using a chemical vapor deposition method, carbon ion implantation and heat treatment, or long-time sacrificial oxidation, is further carried out has been proposed as a method of reducing the carbon vacancies in a SiC epitaxial film. For example, refer to L. Storasta, et al., "Reduction of traps and improvement of carrier lifetime in 4H—SiC epilayers by ion implantation", AIP: Applied Physics Letters (USA), American Institute of Physics, 2007, Volume 90, Pages 062116-1 to 062116-3 (Non-Patent Literature 2) and T. Hiyoshi, et al., "Reduction of Deep Levels and Improvement of Carrier Lifetime in n-Type 4H—SiC by Thermal Oxidation", APEX: Applied Physics Express, Applied Physics, 2009, Volume 2, Pages 041101-1 to 041101-3 (Non-Patent Literature 3).

However, the disclosures of Non-Patent Literature 2 and 3 are such that, after fabricating a SiC single crystal substrate wherein a SiC epitaxial film is deposited on a 4H—SiC substrate, it is necessary to carry out a step for reducing carbon vacancies in the SiC epitaxial film in addition to steps of forming an element structure on the SiC single crystal substrate, and there is a problem in that throughput decreases.

The invention, in order to resolve the challenges of the heretofore described existing technology, has an object of providing a method of manufacturing a silicon carbide semiconductor device with a long carrier lifetime, without carrying out an additional step after fabricating a silicon carbide single crystal substrate using a chemical vapor deposition method.

SUMMARY OF INVENTION

In order to resolve the heretofore described challenges, thus achieving the object of the invention, a silicon carbide semiconductor device manufacturing method according to an aspect of the invention has the following characteristics. Firstly, growing a silicon carbide single crystal film at a first temperature on a silicon carbide semiconductor substrate using chemical vapor deposition is carried out. Next, after the growth step, a first cooling step of cooling the silicon carbide semiconductor substrate from the first temperature to a second temperature, which is lower than the first temperature, in an atmosphere of a carbon-containing gas is carried out. Next, after the first cooling step, a second cooling step of cooling the silicon carbide semiconductor substrate to a third temperature, which is lower than the second temperature, in a hydrogen gas atmosphere is carried out.

Also, the silicon carbide semiconductor device manufacturing method according to the heretofore described aspect of the invention is characterized in that the first cooling step may be carried out in a carbon-and-chlorine-containing gas atmosphere.

Also, the silicon carbide semiconductor device manufacturing method according to the heretofore described aspect of the invention is characterized in that the first cooling step may be carried out in a mixed gas atmosphere containing a carbon-and-chlorine-containing gas added to hydrogen gas.

Also, the silicon carbide semiconductor device manufacturing method according to the heretofore described aspect of the invention is characterized in that the mixed gas atmosphere is such that the carbon-containing gas is added at a ratio of 0.1% to 0.3% with respect to the hydrogen gas.

Also, the silicon carbide semiconductor device manufacturing method according to the heretofore described aspect of the invention is characterized in that, in the mixed gas atmosphere, the chlorine-containing gas is added at a ratio of 0.5% to 1.0% with respect to the hydrogen gas.

Also, the silicon carbide semiconductor device manufacturing method according to the heretofore described aspect of the invention is characterized in that, in the second cooling step (c), the silicon carbide single crystal film includes $Z_{1/2}$ centers and $EH_{6/7}$ centers, and the $Z_{1/2}$ centers have a density in the silicon carbide single crystal film of about $6.7\times10^{12}$ $cm^{-3}$, and the $EH_{6/7}$ centers existing in the silicon carbide single crystal film have a density of about $2.7\times10^{12}$ $cm^{-3}$.

According to the invention, cooling is carried out in a mixed gas atmosphere wherein a carbon-containing gas is added to hydrogen gas after a silicon carbide single crystal film is grown on a silicon carbide semiconductor substrate, whereby carbon vacancies in the silicon carbide single crystal film are filled in by carbon atoms in the carbon-containing gas, and it is thus possible to reduce the carbon vacancies in the silicon carbide single crystal film. Therefore, it is possible to reduce $Z_{1/2}$ centers and $EH_{6/7}$ centers that form lifetime killers generated because of carbon vacancies in the silicon carbide single crystal film. Therefore, it is possible to increase the carrier lifetime of the silicon carbide single crystal film. In this way, it is possible to reduce the carbon vacancies in the silicon carbide single crystal film during a step for fabricating a silicon carbide single crystal substrate using a chemical vapor deposition method, that is, during a silicon carbide single crystal film formation step carried out in a reactor.

Advantageous Effects of Invention

According to the silicon carbide semiconductor device manufacturing method according to the invention, an advantage is achieved in that it is possible to provide a silicon carbide semiconductor device with a long carrier lifetime without carrying out an additional step after a silicon carbide single crystal substrate is fabricated using a chemical vapor deposition method.

BRIEF DESCRIPTION OF THE DRAWINGS

FIG. 3 is a table showing the relationship between the amount of gas added when cooling and the density of crystal defects in an epitaxial film in the case of the silicon carbide semiconductor device manufacturing method according to Embodiment 1;

FIG. 4 is a table showing the relationship between the amount of gas added when cooling and the density of crystal defects in an epitaxial film in the case of the silicon carbide semiconductor device manufacturing method according to Embodiment 2;

FIG. 6 is a table showing the carrier lifetime of a silicon carbide semiconductor device fabricated in accordance with the silicon carbide semiconductor device manufacturing method according to Embodiment 2.

DETAILED DESCRIPTION OF THE INVENTION

Hereafter, referring to the attached drawings, a detailed description will be given of preferred embodiments of a silicon carbide semiconductor device manufacturing method according to the invention. In the following description of the embodiments and in the attached drawings, the same reference signs are given to the same configurations, and redundant descriptions are omitted.

Embodiment 1

Figure 1A:
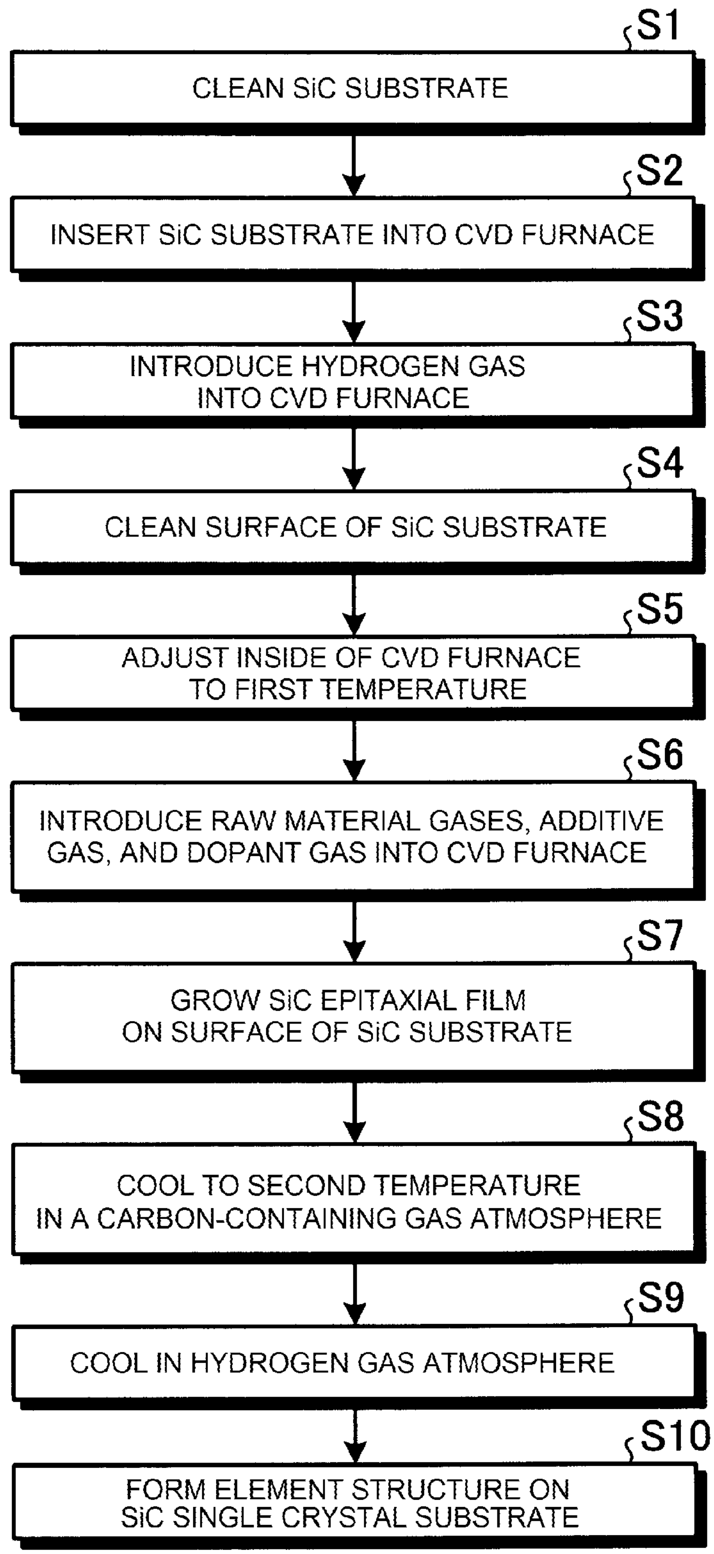
FIG. 1A is a flowchart showing an outline of a silicon carbide semiconductor device manufacturing method according to Embodiment 1.
Figures 1B, 2:
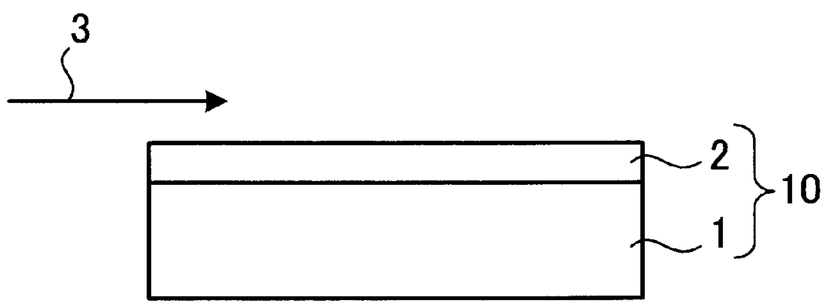
FIG. 1B is a sectional view showing a state partway through the manufacture of the silicon carbide semiconductor device according to Embodiment 1.
FIG. 2 is a table showing the relationship between the amount of gas added when cooling and the density of crystal defects in an epitaxial film in the case of a silicon carbide semiconductor device manufacturing method of a comparison example.

A description will be given of a silicon carbide semiconductor device manufacturing method according to Embodiment 1, with a case of fabricating (manufacturing) a semiconductor device using silicon carbide four layer repeat hexagonal crystals (4H—SiC) as a semiconductor material as an example. FIG. 1A is a flowchart showing an outline of the silicon carbide semiconductor device manufacturing method according to Embodiment 1. FIG. 1B is a sectional view showing a state partway through the manufacture of the silicon carbide semiconductor device according to Embodiment 1. Firstly, a substrate (4H—SiC substrate) 1 formed of 4H—SiC is prepared, and cleaned using a general organic cleaning method or RCA cleaning method (step S1). A main surface of the 4H—SiC substrate 1 may be, for example, a 4° off-oriented (0001) Si surface.

Next, the 4H—SiC substrate 1 is inserted into a reactor (a chamber, not shown) for growing a 4H—SiC single crystal film (hereafter referred to as a SiC epitaxial film (silicon carbide single crystal film) 2 using a chemical vapor deposition (CVD) method (step S2). Next, the inside of the reactor is evacuated until a vacuum of, for example, 1×10-3 Pa or less is reached. Next, hydrogen ($H_2$) gas refined using a general refiner is introduced into the reactor at a flow rate of, for example, 20 L/minute for 15 minutes, thereby substituting the atmosphere inside the reactor with a $H_2$ atmosphere (step S3).

Next, the surface of the 4H—SiC substrate 1 is cleaned by a chemical etching using the $H_2$ gas (step S4). Specifically, the reactor is heated by, for example, high frequency induction, with $H_2$ gas still being introduced at 20 L/minute. Further, the temperature inside the furnace is raised to 1,600° C., and that temperature is maintained for 10 minutes. By so doing, the surface of the 4H—SiC substrate 1 is cleaned. The temperature inside the reactor is measured using, for example, a radiation thermometer, and controlled using control means omitted from the drawings.

Next, the temperature inside the reactor is adjusted to a first temperature, specifically, for example, 1,700° C., for growing the SiC epitaxial film 2 (step S5). Next, in a state wherein the hydrogen gas introduced in step S3 is introduced as a carrier gas at a flow rate of 20 L/minute, raw material gases, a gas to be added to the raw material gases (hereafter referred to as an additive gas), and a dopant gas are introduced into the reactor (step S6). In FIG. 1B, the raw material gases, additive gas, dopant gas, and carrier gas are shown collectively by an arrow 3.

In step S6, a silicon (Si)-containing gas and a carbon (C)-containing gas are used as the raw material gases. The silicon-containing gas may be, for example, a monosilane gas diluted with hydrogen (hereafter referred to as $SiH_4/H_2$). The carbon-containing gas (hereafter referred to as a first carbon-containing gas) may be, for example, a dimethylmethane gas diluted with hydrogen (hereafter referred to as $C_3H_8/H_2$). The first carbon-containing gas may be regulated so that, for example, the ratio of the number of carbon atoms to the number of silicon atoms in the silicon-containing gas (hereafter referred to as a C/Si ratio) is 1.0.

A chlorine (Cl)-containing gas, for example, may be used as the additive gas. That is, epitaxial growth is carried out in step S7, to be described hereafter, using a halide CVD method that uses a halogen compound. The chlorine-containing gas may be, for example, hydrogen chloride (HCl) gas. The chlorine-containing gas may be regulated so that, for example, the ratio of the number of chlorine atoms to the number of silicon atoms in the silicon-containing gas (hereafter referred to as a Cl/Si ratio) is 3.0. Nitrogen (N2) gas, for example, may be used as the dopant gas.

Next, using the raw material gases, additive gas, dopant gas, and carrier gas introduced in step S6, the SiC epitaxial film 2 is grown on the surface of the 4H—SiC substrate 1 using a chemical vapor deposition (CVD) method (step S7). Specifically, the SiC epitaxial film 2 is grown on the 4H—SiC substrate 1 for, for example, 30 minutes by the temperature inside the reactor being maintained at 1,700° C. (the first temperature), and the raw material gases being thermally decomposed by the carrier gas.

Next, the 4H—SiC substrate 1 on which the SiC epitaxial film 2 is deposited is cooled in an atmosphere of a carbon-containing gas diluted with hydrogen gas (hereafter referred to as a second carbon-containing gas) until the temperature inside the reactor decreases (a temperature reduction) to a second temperature lower than the first temperature (step S8). Furthermore, the 4H—SiC substrate 1 on which the SiC epitaxial film 2 is deposited is cooled in a hydrogen gas atmosphere until the temperature inside the reactor decreases to a third temperature lower than the second temperature (step S9). A SiC single crystal substrate 10 wherein the SiC epitaxial film 2 is deposited on the 4H—SiC substrate 1 is fabricated by the steps thus far.

Specifically, in step S8, a $C_3H_8$ gas, for example, is added as the second carbon-containing gas in a state wherein hydrogen gas is introduced as a carrier gas into the reactor at a flow rate of 20 L/minute (that is, a $C_3H_8/H_2$ gas atmosphere). The 4H—SiC substrate 1 on which the SiC epitaxial film 2 is deposited is exposed to the $C_3H_8/H_2$ gas atmosphere until the temperature inside the reactor reaches, for example, 1,300° C. (the second temperature). It is good when the amount of the second carbon-containing gas added is within a range of, for example, 0.1% or more, 0.3% or less, and preferably 0.2% or more, 0.3% or less, of the hydrogen gas (20 L/minute). The reason for this will be described hereafter.

It is good when the second temperature is 1,300° C. or more, 1,500° C. or less. The reason for this is that the cooling time with the second carbon-containing gas is increased by the temperature being reduced from the growth temperature to, for example, 1,300° C., and it is thus possible to increase the supply time of the carbon (C)-containing gas. Preferably, it is good when the second temperature is 1,300° C. The reason for this is to increase the cooling time with the second carbon-containing gas, as heretofore described, and to prevent carbon from precipitating and an internal member in the growth furnace (reactor) from becoming discolored, which happens when the second temperature drops to 1,300° C. or lower.

Also, in step S9, the 4H—SiC substrate 1 on which the SiC epitaxial film 2 is deposited is cooled in a state wherein hydrogen gas is introduced as the carrier gas into the reactor at a flow rate of 20 L/minute until the temperature inside the reactor reaches, for example, room temperature (25° C., the third temperature). In steps S8 and S9, carbon vacancies in the SiC epitaxial film 2 are reduced, and the SiC single crystal substrate 10 is fabricated including the SiC epitaxial film 2 with few crystal defects forming lifetime killers. Subsequently, the SiC single crystal substrate 10 is removed from the reactor, and the SiC semiconductor device is completed by a desired element structure (not shown) being formed (step S10).

Next, verification of the amount of the second carbon-containing gas added in step S8 is carried out. FIG. 2 is a table showing the relationship between the amount of gas added when cooling and the density of crystal defects in the epitaxial film in the case of a silicon carbide semiconductor device manufacturing method of a comparison example. FIG. 3 is a table showing the relationship between the amount of gas added when cooling and the density of crystal defects in the epitaxial film in the case of the silicon carbide semiconductor device manufacturing method according to Embodiment 1. Firstly, the SiC single crystal substrate 10 wherein the SiC epitaxial film 2 is deposited on the 4H—SiC substrate 1 is fabricated in accordance with Embodiment 1 (hereafter referred to as a first example).

In the first example, hydrogen gas is introduced into the reactor as the carrier gas at a flow rate of 20 L/minute. A $SiH_4/H_2$ gas 50% diluted with hydrogen is used as the silicon-containing gas, and a $C_3H_8/H_2$ gas 20% diluted with the first carbon and hydrogen is used. The C/Si ratio is taken to be 1.0. HCl gas is used as the additive gas, and the Cl/Si ratio is taken to be 3.0. Specifically, the flow rates of the $SiH_4/H_2$ gas, $C_3H_8/H_2$ gas, and HCl gas are taken to be 200 sccm, 166 sccm, and 300 sccm respectively. Nitrogen gas is used as the dopant gas, and the flow rate of the nitrogen gas is regulated so that the carrier concentration of the SiC epitaxial film 2 is $2\times10^{15}/cm^3$.

The first temperature for growing the SiC epitaxial film 2 is taken to be 1,700° C., and the growth time of the SiC epitaxial film 2 is taken to be 30 minutes. In step S8, hydrogen gas (20 L/minute) is introduced, a $C_3H_8$ gas is added as the second carbon-containing gas (that is, a $C_3H_8/H_2$ gas atmosphere), and the temperature inside the reactor is lowered from 1,700° C. to 1,300° C. In step S9, hydrogen gas is introduced into the reactor at a flow rate of 20 L/minute. Also, the amount of $C_3H_8$ gas added with respect to the hydrogen gas in step S8 is variously changed, whereby a plurality of first examples are fabricated (hereafter referred to as samples 1-1 to 1-4).

Specifically, the samples 1-1 to 1-4 are such that the amounts of $C_3H_8$ gas added with respect to the hydrogen gas (20 L/minute) in step S8 are 0.1% (corresponding to 20 sccm), 0.2% (corresponding to 40 sccm), 0.3% (corresponding to 60 sccm), and 0.4% (corresponding to 80 sccm) respectively. The figures in parentheses are the amounts of $C_3H_8$ gas added. Further, the density of the $Z_{1/2}$ centers clearly observed in the SiC epitaxial film 2 in a temperature range of 80K to 680K is measured using isothermal capacitance transient spectroscopy (ICTS) for the samples 1-1 to 1-4. The results of the measurements are shown in FIG. 3. In FIG. 3, the figure of 0% for the amount of $C_3H_8$ gas added with respect to hydrogen gas is that of the comparison example, to be described hereafter.

A sample such that a 4H—SiC substrate on which a SiC epitaxial film is deposited is cooled without $C_3H_8$ gas being introduced in step S8 is fabricated as a comparison (hereafter referred to as the comparison example). That is, the comparison example is such that the process from step 8 to step 9 is carried out in a state wherein only hydrogen gas is introduced, at a flow rate of 20 L/minute, into the reactor. Conditions other than this when fabricating the comparison example are the same as those of the first example. The density of the $Z_{1/2}$ centers and the density of the $EH_{6/7}$ centers clearly observed in the SiC epitaxial film 2 in a temperature range of 80K to 680K are measured using isothermal capacitance transient spectroscopy for the comparison example. The results of the measurements are shown in FIG. 2.

From the results shown in FIGS. 2 and 3, the $Z_{1/2}$ center density in the comparison example is $6.2\times10^{13}$ $cm^{-3}$, while the $Z_{1/2}$ center density in the first example is $1.4\times10^{13}$ $cm^{-3}$ or less. Consequently, it is confirmed that the first example is such that the $Z_{1/2}$ center density can be reduced further than in the comparison example. The reason for this is that carbon atoms in the $C_3H_8$ gas are incorporated into the SiC epitaxial film 2, the carbon vacancies in the SiC epitaxial film 2 are filled in by the incorporated carbon atoms, and the carbon vacancies in the SiC epitaxial film 2 are thus reduced. By the carbon vacancies in the SiC epitaxial film 2 being reduced, $EH_{6/7}$ centers generated because of carbon vacancies, in the same way as the $Z_{1/2}$ centers, are also reduced. Therefore, the first example is such that the $EH_{6/7}$ center density can be reduced further than in the comparison example.

Furthermore, from the results shown in FIG. 3, it is confirmed that the greater the amount of $C_3H_8$ gas added in step S8, the further the $Z_{1/2}$ center density decreases. Also, the $Z_{1/2}$ center density when the amount of $C_3H_8$ gas added with respect to the hydrogen gas is 0.4% is practically the same as the $Z_{1/2}$ center density when the amount of $C_3H_8$ gas added with respect to the hydrogen gas is 0.2% to 0.3%. That is, no further decrease in the $Z_{1/2}$ center density is seen when the amount of $C_3H_8$ gas added with respect to the hydrogen gas is 0.4% or more. Therefore, it is good when the amount of $C_3H_8$ gas added with respect to the hydrogen gas in step S8 is 0.1% to 0.3%, and preferably 0.2% to 0.3%.

As heretofore described, according to Embodiment 1, cooling is carried out in a mixed gas atmosphere wherein a second carbon-containing gas is added to hydrogen gas after a SiC epitaxial film is grown on a 4H—SiC substrate, whereby carbon vacancies in the SiC epitaxial film are filled in by carbon atoms in the second carbon-containing gas, and it is thus possible to reduce the carbon vacancies in the SiC epitaxial film. Therefore, it is possible to reduce $Z_{1/2}$ centers and $EH_{6/7}$ centers forming lifetime killers generated because of carbon vacancies in the SiC epitaxial film. Therefore, it is possible to increase the carrier lifetime of the SiC epitaxial film. In this way, it is possible to reduce the carbon vacancies in the SiC epitaxial film during a step for fabricating a SiC single crystal substrate using a chemical vapor deposition method, that is, during a SiC epitaxial film formation step carried out in a reactor. Therefore, it is possible to provide a silicon carbide semiconductor device with a long carrier lifetime without carrying out an additional step, such as an ion implantation or sacrificial oxidation, after the SiC single crystal substrate is fabricated, as has been the case to date. Consequently, it is possible to improve throughput when fabricating a silicon carbide semiconductor device with a long carrier lifetime.

Embodiment 2

Next, a description will be given of a silicon carbide semiconductor device manufacturing method according to Embodiment 2. The silicon carbide semiconductor device manufacturing method according to Embodiment 2 differs from the silicon carbide semiconductor device manufacturing method according to Embodiment 1 in the following three ways. The first difference is that the C/Si ratio of the raw material gases is taken to be 1.25. The second difference is that the first temperature for growing the SiC epitaxial film 2 is taken to be 1,640° C. The third difference is that a chlorine-containing gas (hereafter referred to as a second chlorine-containing gas) is further added in step 8.

Specifically, in step S5, the temperature inside the reactor is adjusted to 1,640° C. (the first temperature). In step S6, the raw material gases are introduced so that the C/Si ratio becomes 1.25. In step S7, the growth temperature of the SiC epitaxial film 2 is taken to be 1,640° C. In step S8, the temperature inside the reactor is lowered from 1,640° C. to the second temperature (for example, 1,300° C.). The atmosphere inside the reactor at this time is an atmosphere of the second carbon-containing gas and second chlorine-containing gas diluted with hydrogen gas.

HCl gas, for example, may be used as the second chlorine-containing gas. It is good when the amount of the second chlorine-containing gas added is within a range of, for example, 0.5% or more, 1.0% or less, with respect to the hydrogen gas (20 L/minute). The reason for this will be described hereafter. It is good when the first temperature is 1,550° C. or more, 1,700° C. or less. The reason for this is that 3C—SiC is formed at low temperatures, while step bunching occurs on the surface at high temperatures of 1,700° C. or more, resulting in surface unevenness. Preferably, it is good when the first temperature is 1,640° C. The reason for this is so as to reliably grow 4H—SiC with no step bunching occurring. Conditions other than these of Embodiment 2 are the same as those of Embodiment 1.

Next, verification of the amount of the second chlorine-containing gas added in step S8 is carried out. FIG. 4 is a table showing the relationship between the amount of gas added when cooling and the density of crystal defects in the epitaxial film in the case of the silicon carbide semiconductor device manufacturing method according to Embodiment 2. The SiC single crystal substrate 10 wherein the SiC epitaxial film 2 is deposited on the 4H—SiC substrate 1 is fabricated in accordance with Embodiment 2 (hereafter referred to as a second example).

In the second example, the C/Si ratio is taken to be 1.25. The first temperature for growing the SiC epitaxial film 2 is taken to be 1,640° C. In step S8, hydrogen gas (20 L/minute) is introduced, a $C_3H_8$ gas is added as the second carbon-containing gas, HCl gas is added as the second chlorine-containing gas (that is, a $C_3H_8$/HCl/$H_2$ gas atmosphere), and the temperature inside the reactor is lowered from 1,640° C. to 1,300° C. Also, the amount of $C_3H_8$ gas added with respect to the hydrogen gas in step S8 is taken to be 0.2% (corresponding to 40 sccm), and the amount of HCl gas added with respect to the hydrogen gas is variously changed, whereby a plurality of second examples are fabricated (hereafter referred to as samples 2-1 to 2-4).

Specifically, the samples 2-1 to 2-4 are such that the amounts of HCl gas added with respect to the hydrogen gas (20 L/minute) in step S8 are 0% (that is, only 0.2% of $C_3H_8$ gas is added, practically corresponding to the first example), 0.5% (corresponding to 100 sccm), 1.0% (corresponding to 200 sccm), and 1.5% (corresponding to 300 sccm) respectively. The figures in parentheses are the amounts of HCl gas added. Configurations of the second example other than this are the same as those of the first example. Further, the density of the $Z_{1/2}$ centers clearly observed in the SiC epitaxial film 2 in a temperature range of 80K to 680K is measured using isothermal capacitance transient spectroscopy for the samples 2-1 to 2-4. The results of the measurements are shown in FIG. 4.

From the results shown in FIG. 4, the $Z_{1/2}$ center density in sample 2-1, in which no HCl gas is added, is $9.9\times10^{12}$ $cm^{-3}$, while the $Z_{1/2}$ center density in samples 2-2 to 2-4, in which HCl gas is added, is $7.9\times10^{12}$ $cm^{-3}$ or less. Consequently, it is confirmed that samples 2-2 to 2-4 of the second example are such that the $Z_{1/2}$ center density can be reduced further than in the first example. The reason for this is as follows. By $C_3H_8$ gas being added, the same advantages as in the first example are obtained. Furthermore, the silicon atoms in the SiC epitaxial film 2 are vaporized by the HCl gas, and unattached carbon atoms remain in the SiC epitaxial film 2. Carbon vacancies in the SiC epitaxial film 2 are filled in by the remaining carbon atoms, and the carbon vacancies in the SiC epitaxial film 2 are thus reduced. Also, it is confirmed that the greater the amount of HCl gas added with respect to the hydrogen gas, the further the $Z_{1/2}$ center density decreases. The reason for this is that, by the C/Si ratio being increased in comparison with the first example and the first temperature being reduced by 60° C. in comparison with the first example, the incorporation of C into the film increases, and it is possible to reduce carbon vacancies in the SiC epitaxial film 2 further than in the first example.

Figure 5:
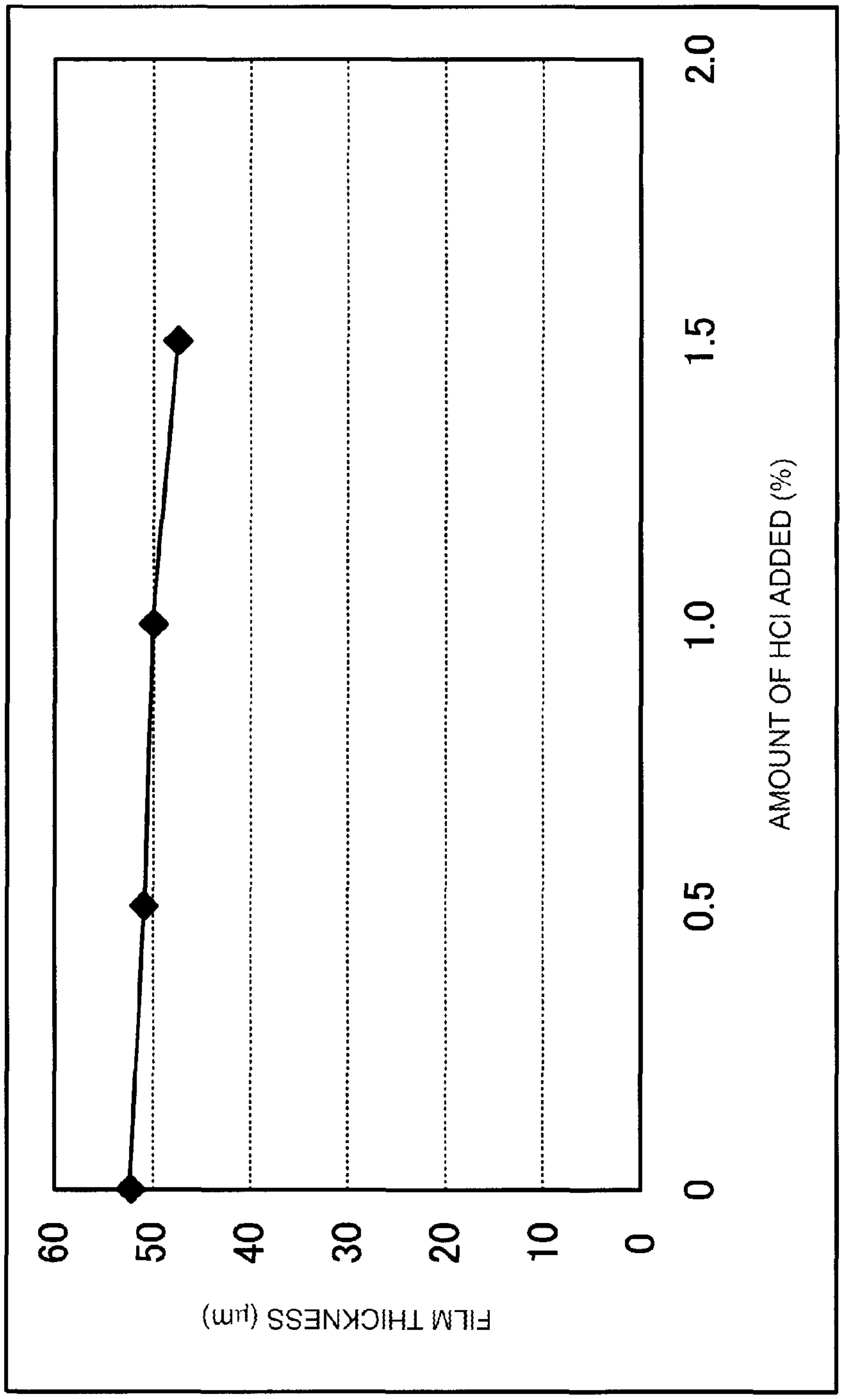
FIG. 5 is a characteristic diagram showing the relationship between the amount of gas added when cooling and the thickness of the epitaxial film in the case of the silicon carbide semiconductor device manufacturing method according to Embodiment 2.

Next, the thickness of the SiC epitaxial film 2 is measured for each of the samples 2-1 to 2-4 after completion of the SiC single crystal substrate 10, verification of the relationship between the amount of HCl gas added with respect to the hydrogen gas and the thickness of the SiC epitaxial film 2 is carried out, and the results are shown in FIG. 5. FIG. 5 is a characteristic diagram showing the relationship between the amount of gas added when cooling and the thickness of the epitaxial film in the case of the silicon carbide semiconductor device manufacturing method according to Embodiment 2. From the results shown in FIG. 5, it is confirmed that the greater the amount of HCl gas added with respect to the hydrogen gas, the thinner the SiC epitaxial film 2 becomes. The reason for this is that the SiC epitaxial film 2 is etched by chlorine atoms in the HCl gas. In particular, sample 2-4 (wherein the amount of HCl gas added with respect to the hydrogen gas is 1.5%) is such that the thickness of the SiC epitaxial film 2 is considerably reduced. Consequently, in order to keep the reduction in the thickness of the SiC epitaxial film 2 to the desired amount, and reduce the carbon vacancies in the SiC epitaxial film 2, it is preferable that the amount of HCl gas added with respect to the hydrogen gas is 0.5% to 1.0%.

Also, samples 2-2 to 2-4 of the second example are such that, as the carbon vacancies in the SiC epitaxial film 2 can be reduced further than in the first example, $EH_{6/7}$ centers generated because of carbon vacancies, in the same way as the $Z_{1/2}$ centers, are also reduced further than in the first example. Consequently, samples 2-2 to 2-4 of the second example are such that the $EH_{6/7}$ center density can be reduced further than in the first example. For example, sample 2-3 (wherein the amount of HCl gas added with respect to the hydrogen gas is 1.0%) is such that it is confirmed that the $EH_{6/7}$ center density is $2.7\times10^{12}$ $cm^{-3}$.

Results of the carrier lifetime of the sample 2-2 and heretofore described comparison example being measured using a microwave photoconductive decay (μ-PCD) method are shown in FIG. 6. FIG. 6 is a table showing the carrier lifetime of a silicon carbide semiconductor device fabricated in accordance with the silicon carbide semiconductor device manufacturing method according to Embodiment 2. The carrier lifetime in the comparison example is 0.10 μs to 0.18 μs. As opposed to this, the carrier lifetime of the second example (sample 2-2) is 4.0 μs to 10 μs, and it is thus confirmed that the carrier lifetime can be increased further than in the comparison example.

As heretofore described, according to Embodiment 2, it is possible to obtain the same advantages as in Embodiment 1. Also, according to Embodiment 2, a second chlorine-containing gas is further added to the gas atmosphere during cooling of a 4H—SiC substrate on which a SiC epitaxial film is deposited, because of which silicon atoms in the SiC epitaxial film are dissolved, and carbon vacancies in the SiC epitaxial film are filled in by the remaining carbon atoms. Therefore, it is possible to reduce the carbon vacancies in the SiC epitaxial film further in comparison with when only the second carbon-containing gas is added.

As heretofore described, the invention can be changed in various ways, and in each of the embodiments, for example, the types of raw material gases, additive gas, carrier gas, dopant gas, second carbon-containing gas, and second chlorine-containing gas, the first to third temperatures, and the like, are variously set in accordance with the required specifications and the like.

As heretofore described, the silicon carbide semiconductor device manufacturing method according to the invention is useful in a semiconductor device fabricated using a SiC single crystal substrate formed by a SiC single crystal film being deposited on a SiC substrate.

What is claimed is:

1. A silicon carbide semiconductor device manufacturing method, comprising:

a. growing a silicon carbide single crystal film at a first temperature on a silicon carbide semiconductor substrate using chemical vapor deposition (CVD), the first temperature being a constant temperature between 1550° C. and 1700° C.;

b. cooling the silicon carbide semiconductor substrate from the first temperature to a second temperature, which is lower than the first temperature, in an atmosphere of a carbon-and-chlorine-containing gas after growing the silicon carbide crystal film, the second temperature being between 1300° C. and 1500° C.; and c. subsequently cooling the silicon carbide semiconductor substrate to a third temperature, which is lower than 1300° C., in a hydrogen gas atmosphere such that the silicon carbide single crystal film grown at the first temperature is exposed to the hydrogen gas atmosphere, wherein, prior to growing the silicon carbide single crystal film at the first temperature, a gas mixture including a first raw material gas including silicon and a second raw material gas including carbon, an additive gas including chlorine, and a dopant gas is introduced into a CVD furnace for performing the CVD.

2. The silicon carbide semiconductor device manufacturing method according to claim 1, wherein cooling in step (b)

is carried out in a mixed gas atmosphere containing a carbon-and-chlorine-containing gas added to hydrogen gas.

3. The silicon carbide semiconductor device manufacturing method according to claim 2, wherein, in the mixed gas atmosphere, the carbon-containing gas is added at a ratio of 0.1% to 0.3% with respect to the hydrogen gas.

4. The silicon carbide semiconductor device manufacturing method according to claim 3, wherein the silicon carbide single crystal film includes $Z_{1/2}$ centers and $EH_{6/7}$ centers, and wherein, in step (c), the $Z_{1/2}$ centers have a density of about $6.7\times10^{12}$ $cm^{-3}$, and the $EH_{6/7}$ centers have a density of about $2.7\times10^{12}$ $cm^{-3}$.

5. The silicon carbide semiconductor device manufacturing method according to claim 2, wherein the mixed gas atmosphere is such that the chlorine-containing gas is added at a ratio of 0.5% to 1.0% with respect to the hydrogen gas.

6. The silicon carbide semiconductor device manufacturing method according to claim 5, wherein the silicon carbide single crystal film includes $Z_{1/2}$ centers and $EH_{6/7}$ centers, and wherein the $Z_{1/2}$ centers have a density of about $6.7\times10^{12}$ $cm^{-3}$, and the $EH_{6/7}$ centers have a density of about $2.7\times10^{12}$ $cm^{-3}$.

7. The silicon carbide semiconductor device manufacturing method according to claim 2, wherein the silicon carbide single crystal film includes $Z_{1/2}$ centers and $EH_{6/7}$ centers, and wherein, in step (c), the $Z_{1/2}$ centers have a density of about $6.7\times10^{12}$ $cm^{-3}$, and the $EH_{6/7}$ centers have a density of about $2.7\times10^{12}$ $cm^{-3}$.

8. The silicon carbide semiconductor device manufacturing method of claim 1, further comprising:

prior to introducing the gas mixture into the CVD furnace, introducing the silicon carbide semiconductor substrate into the furnace;

introducing hydrogen gas into the furnace;

cleaning a surface of the silicon carbide semiconductor substrate by chemical etching by heating the CVD furnace to a predetermined heating temperature; and reducing the temperature in the CVD furnace to the first temperature.

9. The silicon carbide semiconductor device manufacturing method of claim 1, wherein the additive gas is hydrogen chloride (HCl).

10. The silicon carbide semiconductor device manufacturing method of claim 1, wherein the dopant gas is nitrogen (N2).

11. The silicon carbide semiconductor device manufacturing method of claim 1, wherein cooling the silicon carbide semiconductor substrate to the third temperature includes stopping a flow of the carbon-and-chlorine-containing gas after cooling the silicon carbide semiconductor substrate to the second temperature, and continuously cooling the silicon carbide semiconductor substrate from the first temperature to the third temperature in the hydrogen gas atmosphere.

12. A silicon carbide semiconductor device manufacturing method, comprising:

a. growing a silicon carbide single crystal film at a first temperature on a silicon carbide semiconductor substrate using chemical vapor deposition, the first temperature being a constant temperature between 1550° C. and 1700° C.;

b. cooling the silicon carbide semiconductor substrate from the first temperature to a second temperature, which is lower than the first temperature, in an atmosphere of a carbon-containing gas after growing the silicon carbide crystal film, the second temperature being between 1300° C. and 1500° C.; and c. subsequently cooling the silicon carbide semiconductor substrate to a third temperature, which is lower than 1300° C., in a hydrogen gas atmosphere such that the silicon carbide single crystal film grown at the first temperature is exposed to the hydrogen gas atmosphere, wherein the silicon carbide single crystal film includes $Z_{1/2}$ centers and $EH_{6/7}$ centers, and wherein, in step (c), the $Z_{1/2}$ centers have a density of about $6.7\times10^{12}$ $cm^{-3}$, and the $EH_{6/7}$ centers have a density of about $2.7\times10^{12}$ $cm^{-3}$.

13. The silicon carbide semiconductor device manufacturing method of claim 12, wherein cooling the silicon carbide semiconductor substrate to the third temperature includes stopping a flow of the carbon-and-chlorine-containing gas after cooling the silicon carbide semiconductor substrate to the second temperature, and continuously cooling the silicon carbide semiconductor substrate from the first temperature to the third temperature in the hydrogen gas atmosphere.

14. A silicon carbide semiconductor device manufacturing method, comprising:

growing a silicon carbide single crystal film at a first temperature on a silicon carbide semiconductor substrate using chemical vapor deposition (CVD), the first temperature being a constant temperature between 1550° C. and 1700° C.;

cooling the silicon carbide semiconductor substrate from the first temperature to a second temperature which is lower than the first temperature in an atmosphere of a carbon-and-chlorine-containing gas after growing the silicon carbide crystal film, the second temperature being between 1300° C. and 1500° C.; and subsequently cooling the silicon carbide semiconductor substrate to a third temperature, which is lower than 1300° C. such that the silicon carbide single crystal film grown at the first temperature is exposed to an atmosphere while the silicon carbide semiconductor substrate is cooled to the third temperature, wherein, prior to growing the silicon carbide single crystal film at the first temperature, a gas mixture including a first raw material gas including silicon and a second raw material gas including carbon, an additive gas including chlorine, and a dopant gas is introduced into a CVD furnace for performing the CVD.

15. The silicon carbide semiconductor device manufacturing method according to claim 14, wherein subsequently cooling the silicon carbide semiconductor substrate to a third temperature is conducted in a hydrogen gas atmosphere.

16. The silicon carbide semiconductor device manufacturing method of claim 14, wherein cooling the silicon carbide semiconductor substrate to the third temperature includes stopping a flow of the carbon-and-chlorine-containing gas after cooling the silicon carbide semiconductor substrate to the second temperature, and continuously cooling the silicon carbide semiconductor substrate from the first temperature to the third temperature in the hydrogen gas atmosphere.

* * * * *